(12) United States Patent
Ströbel-Maier et al.

(10) Patent No.: US 12,424,512 B2
(45) Date of Patent: Sep. 23, 2025

(54) COOLING SYSTEM COMPRISING A SERPENTINE PASSAGEWAY

(71) Applicant: Danfoss Silicon Power GmbH, Flensburg (DE)

(72) Inventors: Henning Ströbel-Maier, Nordborg (DK); Klaus Olesen, Nordborg (DK)

(73) Assignee: DANFOSS SILICON POWER GMBH, Flensburg (DE)

( * ) Notice: Subject to any disclaimer, the term of this patent is extended or adjusted under 35 U.S.C. 154(b) by 466 days.

(21) Appl. No.: 17/766,560

(22) PCT Filed: Oct. 7, 2020

(86) PCT No.: PCT/EP2020/078135
§ 371 (c)(1),
(2) Date: Apr. 5, 2022

(87) PCT Pub. No.: WO2021/069501
PCT Pub. Date: Apr. 15, 2021

(65) Prior Publication Data
US 2023/0120927 A1    Apr. 20, 2023

(30) Foreign Application Priority Data
Oct. 9, 2019 (DE) .......................... 102019127203.3

(51) Int. Cl.
*H01L 23/473* (2006.01)
*H01L 25/07* (2006.01)

(52) U.S. Cl.
CPC .......... *H01L 23/473* (2013.01); *H01L 25/072* (2013.01)

(58) Field of Classification Search
CPC ............................ H01L 23/473; H01L 25/072
See application file for complete search history.

(56) References Cited

U.S. PATENT DOCUMENTS 6,351,381 B1   2/2002  Bilski et al.
2010/0296247 A1  11/2010  Chang et al.
(Continued)

FOREIGN PATENT DOCUMENTS

CN   203831746 U  *  9/2014  ............. B29C 45/73
DE   2937477 A1     4/1981
(Continued)

OTHER PUBLICATIONS

CN 203831746 U Translation (Year: 2014).*
(Continued)

*Primary Examiner* — Jerry-Daryl Fletcher
*Assistant Examiner* — Dario Antonio Deleon
(74) *Attorney, Agent, or Firm* — McCormick, Paulding & Huber PLLC

(57) ABSTRACT

A cooling system (26) comprising a cooling arrangement (24, 24', 24") having a serpentine passageway (20) for a circulating fluid coolant is disclosed. The serpentine passageway (20) is provided between a plurality of walls (6, 8) displaced from each other. A series of baffles (10) each having a proximal portion (12) and a distal portion (14) are disposed within the passageway (20). The baffles (10) extend from one of the walls into the passageway (20). The distal portion (14) has a width ($W_2$) that is larger than the width ($W_1$) of the proximal portion (12).

17 Claims, 8 Drawing Sheets

(56) References Cited

U.S. PATENT DOCUMENTS

2011/0100585 A1* 5/2011 Hohenstein et al. ........................ H05K 7/20927 165/41
2013/0153186 A1 6/2013 Gotou et al.
2016/0109190 A1* 4/2016 Olesen et al. ........ F28F 9/0268 165/170

FOREIGN PATENT DOCUMENTS

| DE | 20205202 U1 | 10/2002 | |
|----|----|----|----|
| DE | 10 2017 101 126 A1 | 7/2018 | |
| EP | 2488669 B1 | 11/2018 | |
| KR | 101609756 B1 * | 4/2016 | ......... H01L 33/0004 |

OTHER PUBLICATIONS

KR 101609756 B1 Translation (Year: 2016).*
International Search Report mailed on Jan. 26, 2021, in connection with International Application No. PCT/EP2020/078135; 3 pages.

* cited by examiner

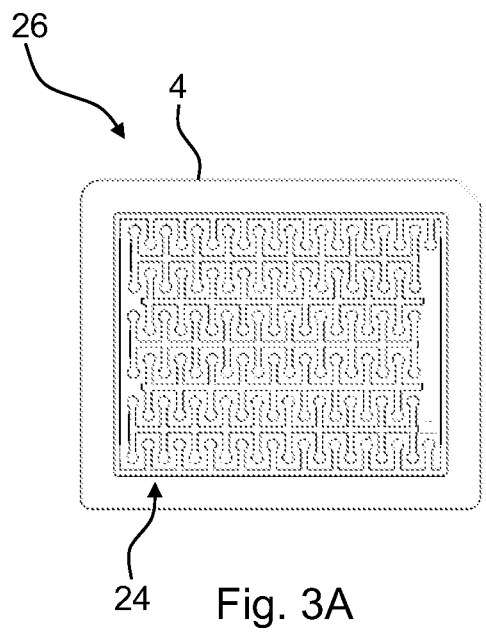
Fig. 3A
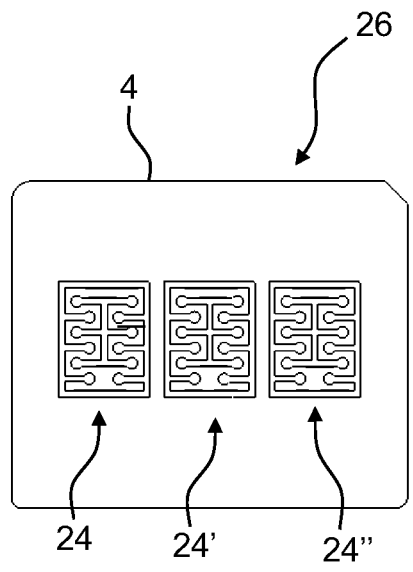
Fig. 3B
Fig. 3C  Fig. 3D  Fig. 3E
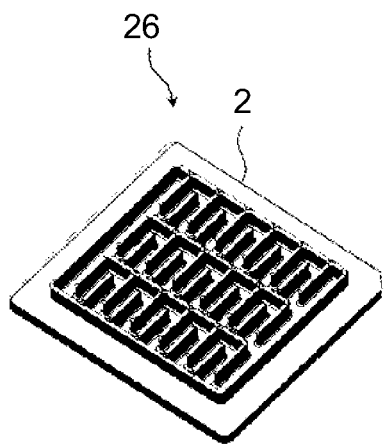 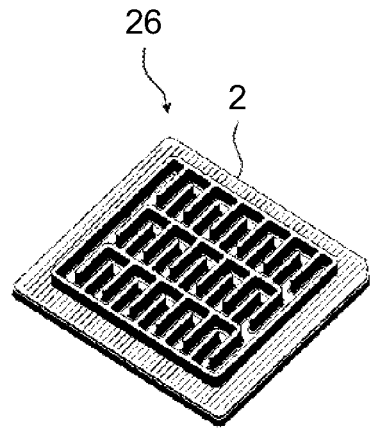 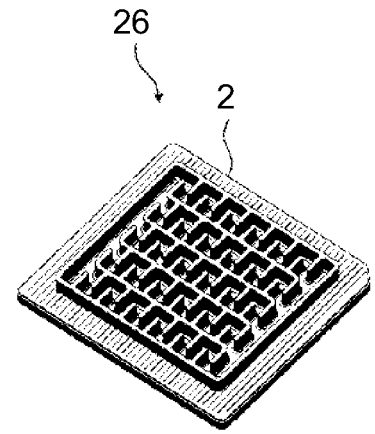
Prior Art

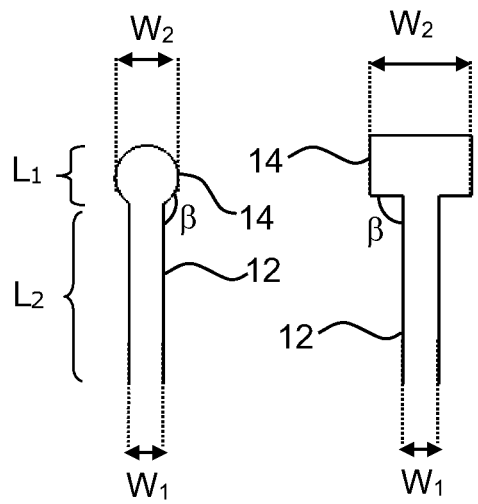 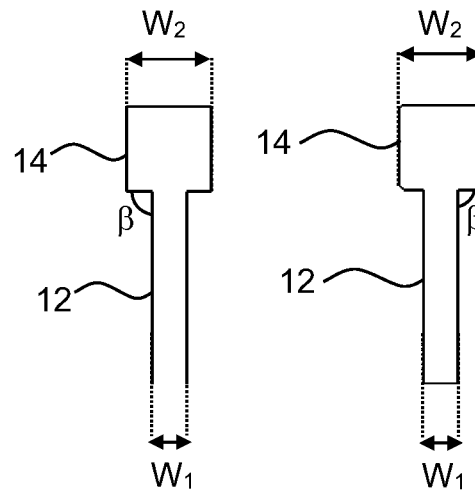
Fig. 4A    Fig. 4B    Fig. 4C    Fig. 4D
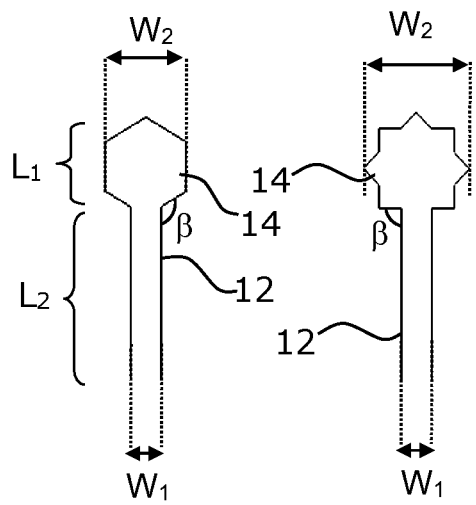 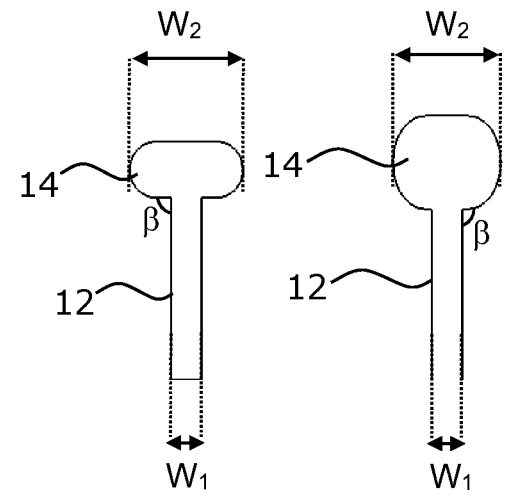
Fig. 4E    Fig. 4F    Fig. 4G    Fig. 4H

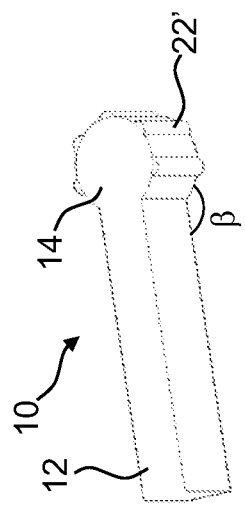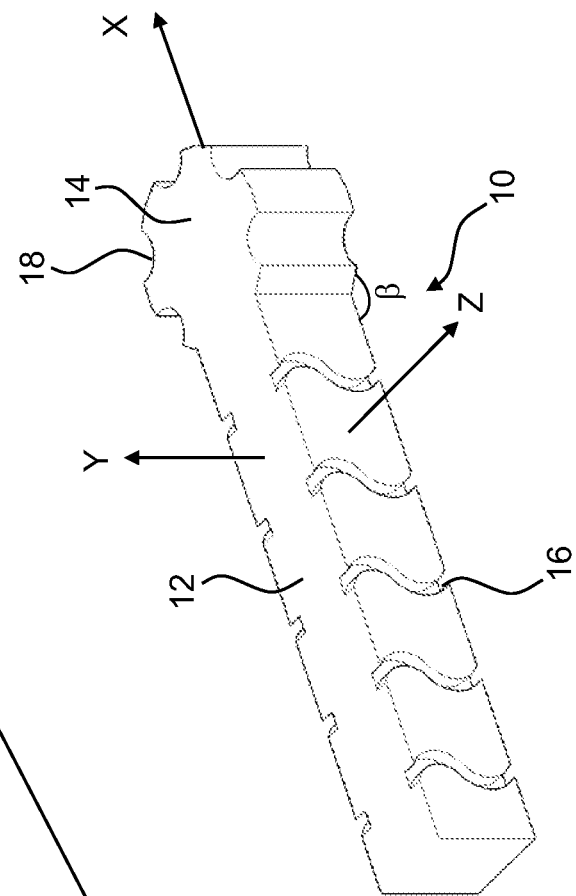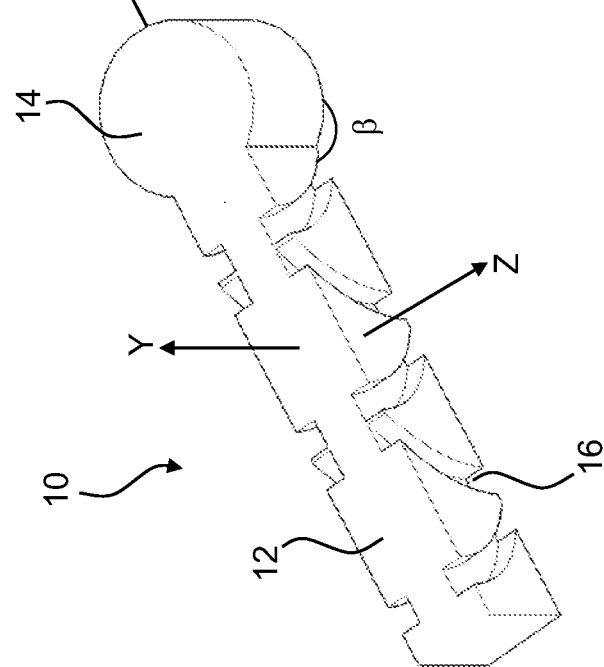

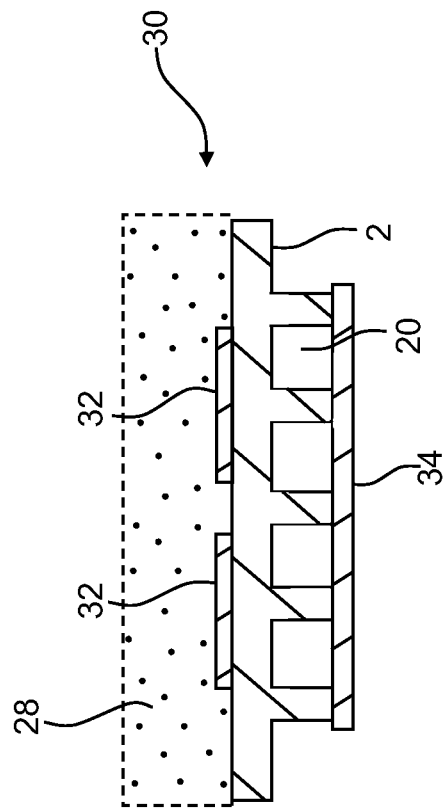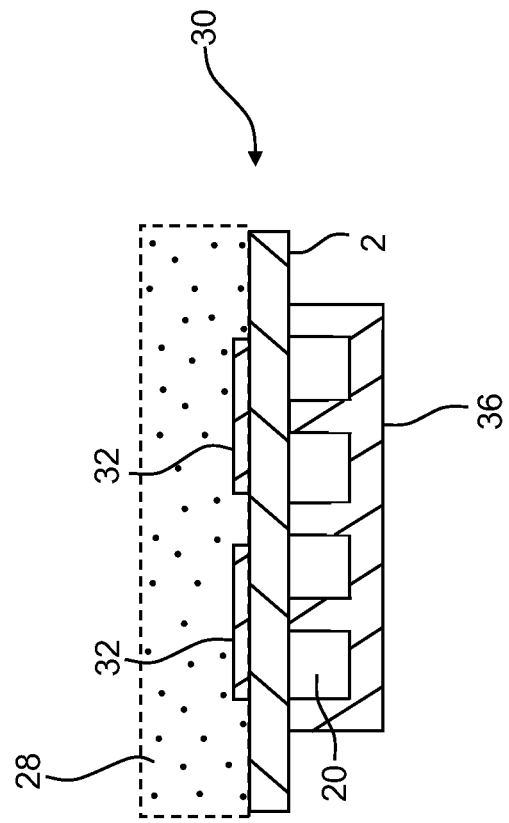

COOLING SYSTEM COMPRISING A SERPENTINE PASSAGEWAY

CROSS-REFERENCE TO RELATED APPLICATION

This application is a National Stage application of International Patent Application No. PCT/EP2020/078135, filed on Oct. 7, 2020, which claims priority to German Application No. 10 2019 127 203.3, filed on Oct. 9, 2019, each of which is hereby incorporated by reference it its entirety.

TECHNICAL FIELD

The present invention relates to a cooling system comprising a cooling arrangement provided with a serpentine passageway for a circulating a fluid coolant.

BACKGROUND

Liquid cooling of power electronics has been a well-established technique for many years. Due to conductive and switching losses in the power components as well as ohmic losses in conductor tracks, every electronic circuit generates heat. There has been a growing focus on the efficiency of cooling due to the ever-increasing power densities of power electronics.

Cooling efficiency is highly relevant because every new generation of power semiconductors tends to be smaller than the predecessor and because the market always desires smaller and more compact solutions. Accordingly, sufficient cooling of power electronics is crucial. Due to high heat transfer coefficients of liquids, liquid cooling outperforms air cooling. Accordingly, liquid cooling has found its way into more and more applications.

Power modules having a large power density typically comprise a baseplate provided with a serpentine passageway for a circulating liquid. The serpentine passageway comprises meandering channels providing a desirable hydrothermal performance and thus a high cooling efficiency.

There are, however, several challenges associated to the prior art meandering channels. The preferred manufacturing process for producing a prior art base plates is cold or hot forging. The narrow walls separating the meandering channels has been found to be a challenge for the forging tool. The large mechanical stresses being present at the ends of the walls limit the lifetime of the forging tool compared to a tool for a traditional pin fin baseplate design.

Furthermore, detailed computational fluid dynamics (CFD) analyses have revealed that so-called dead liquid regions are created right after a turning point at the end of a meander wall. These dead liquid regions do not account for any cooling effect. On the contrary, a dead liquid region creates a pressure drop. Baseplates provided with a plurality of meander channels will have a plurality of dead water regions due to the large number of turning points.

Thus, there is a need for a cooling system which reduces or even eliminates the above-mentioned disadvantages of the prior art.

It is an object of the invention to provide a cooling system comprising a cooling arrangement provided with a serpentine passageway for a circulating fluid coolant, wherein the serpentine passageway can be produced in a manner in which the mechanical stresses of the forging tool are reduced, and the lifetime of the forging tool can be extended.

It is an object of the invention to provide a cooling system comprising a cooling arrangement provided with a serpentine passageway for a circulating fluid coolant, wherein the serpentine passageway has fewer dead liquid regions than the prior art solutions.

SUMMARY

The object of the present invention can be achieved by a cooling system as defined in claim 1. Preferred embodiments are defined in the dependent subclaims, explained in the following description and illustrated in the accompanying drawings.

The cooling system according to the invention is a cooling system comprising a cooling arrangement provided with a serpentine passageway for a circulating fluid coolant, wherein the passageway is provided between a plurality of walls displaced from each other, wherein a series of baffles each having a proximal portion and a distal portion are disposed within the passageway, said baffles extending from one of the walls into the passageway, wherein the distal portion has a width that is larger than the width of the proximal portion, wherein the proximal portion and the distal portion comprise adjacent side walls, wherein the angle between said adjacent sidewalls is less than 180°.

Hereby, it is possible to provide a cooling system comprising a cooling arrangement provided with a serpentine passageway for a circulating fluid coolant, wherein the serpentine passageway can be produced in a manner, in which the mechanical stresses of the forging tool can be reduced. Accordingly, the lifetime of the forging tool can be extended.

Furthermore, the serpentine passageway will have fewer dead liquid (e.g. dead water) regions than the prior art solutions. Accordingly, a higher cooling efficiency of the cooling system can be achieved. By ensuring that the angle between the adjacent side walls of the proximal portion and the distal portion is less than 180°, it is possible to provide a flow that enables a higher cooling efficiency of the cooling system than the prior art solutions.

It may be an advantage to have baffles that are designed to create a flow on either side of a baffle, wherein the flow on either side of the baffle is in opposite directions.

Hereby, the risk of creating dead liquid regions can be minimised.

In one embodiment, the angle between the adjacent side walls of the proximal portion and the distal portion, respectively, is less than 160°.

In one embodiment, the angle between the adjacent side walls of the proximal portion and the distal portion, respectively, is less than 140°.

In one embodiment, the angle between the adjacent side walls of the proximal portion and the distal portion, respectively, is less than 120°.

In one embodiment, the angle between the adjacent side walls of the proximal portion and the distal portion, respectively, is less than 100°.

In one embodiment, the angle between the adjacent side walls of the proximal portion and the distal portion, respectively, is between 90° and less than 135°.

In one embodiment, the proximal portion has a constant width. Accordingly, a baffle has the same width along the entire length of its proximal portion.

In one embodiment, the cooling system is a cooler for electronic components

The cooling system may be a cooler for power electronics such as Insulated Gate Bipolar Transistors (IGBTs) modules.

The fluid coolant may be a liquid. The fluid coolant may by way of example be a water containing liquid.

In one embodiment, the walls displaced from each other have the same thickness.

In one embodiment, the proximal portion of each baffle has the same geometry and thickness.

The distal portion of each baffle has a width that is larger than the width of the proximal portion. The distal portions of different baffles may differ from each other. In one embodiment, however, the distal portions of all the baffles are alike.

In one embodiment, the length of the proximal portion is larger than the length of the distal portion. Hereby, it is possible to provide a huge reduction of the mechanical stresses of the forging tool and thus extending the lifetime of the forging tool.

In one embodiment, the length of the proximal portion is larger than two times the length of the distal portion.

In one embodiment, the length of the proximal portion is larger than three times the length of the distal portion.

In one embodiment, the length of the proximal portion is larger than four times the length of the distal portion.

By increasing the length of the proximal portion relative to the length of the distal portion, it is possible to reduce the mechanical stresses of the forging tool. At the same time the material consumption for producing the proximal portion can be reduced. Accordingly, the production cost can be reduced.

In one embodiment, a number of indentations are provided in the proximal portion. Hereby, it is possible to either reduce the thermal resistance can be reduced by up to while maintaining same pressure drop or maintaining the thermal resistance while reducing the pressure drop caused by the proximal portion. It may be beneficial that several indentations are provided in the proximal portion.

In one embodiment, the indentations extend perpendicular to the longitudinal axis of the proximal portion.

In one embodiment, the indentations have a uniform cross section. Hereby, production of the cooling system may be eased.

It may be advantageous that a number of indentations are provided in the distal portion. The indentations can increase the cooling efficiency of the cooling system. It may be an advantage that several indentations are provided in the distal portion.

In one embodiment, that the indentations extend perpendicular to the longitudinal axis of the proximal portion. Hereby, production of the cooling system may be eased.

In one embodiment, the indentations have a uniform cross section. This may be an advantage from a production perspective.

In one embodiment a number of protrusions are provided in the proximal portion

Hereby, it is possible to either reduce the thermal resistance while maintaining same pressure drop or maintaining the thermal resistance while reducing the pressure drop caused by the proximal portion. It may be beneficial that several protrusions are provided in the proximal portion.

From a production perspective it may be an advantage that the protrusions extend perpendicular to the longitudinal axis of the proximal portion. Furthermore, it may be advantageous that the protrusions have a uniform cross section.

In one embodiment, a number of protrusions are provided in the distal portion. The presence of protrusions may either reduce the thermal resistance while maintaining same pressure drop or maintain the thermal resistance while reducing the pressure drop. It may be an advantage that several protrusions are provided in the distal portion.

In one embodiment, the protrusions extend perpendicular to the longitudinal axis of the proximal portion.

In one embodiment, the protrusions have a uniform cross section.

It may be an advantage that the cooling system comprises a single cooling arrangement. Hereby, the complexity of the cooling system can be minimised. Moreover, a single flow generating unit (e.g. a pump) can be applied.

In one embodiment, the cooling arrangement is arranged on a baseplate. It may be advantageous, that the cooling arrangement is centrally arranged on a baseplate. Hereby, optimum conditions for cooling the central portion of the baseplate can be achieved. This may be an advantage in most situations, in which heat will be generated by power components (e.g. power semiconductors) placed at or close to the central portion of the baseplate.

In one embodiment, the cooling system comprises two cooling arrangements arranged on a baseplate. Hereby, it is possible to place the cooling arrangements in separate positions in order to provide the most efficient cooling.

It may be advantageous, that the cooling arrangements are distanced from each other. This may be an advantage when the heat generating components such as power semiconductors are distanced from each other In one embodiment, that the cooling system comprises three or more cooling arrangements disposed on a baseplate. Hereby, it is possible to place three or more cooling arrangements in different positions in order to provide the must optimum cooling.

When the heat generating components such as power semiconductors are distanced from each other, it may be an advantage, that the cooling arrangements are distanced from each other.

The cross section of the distal portion may have any suitable geometry.

In one embodiment, the cross section of the distal portion is circular.

In one embodiment, the cross section of the distal portion is rectangular.

In one embodiment, the cross section of the distal portion is square.

In one embodiment, the cross section of the distal portion is oval.

In one embodiment, the cross section of the distal portion is hexagonal.

In one embodiment, the cross section of the distal portion is octagonal.

In one embodiment, the cross section of the distal portion is rounded rectangle.

In one embodiment, the cross section of the distal portion is rounded square.

It may be an advantage that the baffles extend parallel to each other.

In one embodiment, the baffles extend basically perpendicular to the wall, from which the baffles extend into the passageway.

It may be advantageous that the baffles are fixed to the wall from which they extend.

In one embodiment, the serpentine passageway comprises a plurality of cooling channels, wherein the open end of the cooling channels is closed with a structure formed as a lid. Accordingly, the cooling system is configured to allow a circulating fluid coolant to flow along the cooling channels.

In one embodiment, the lid is a baseplate. Hereby, heat produced by electronic components such as power semiconductors placed on the baseplate will be transferred through the baseplate to the circulating fluid coolant in the cooling channels. Accordingly, the electronic components can be efficiently cooled.

In one embodiment, the lid is attached to a baseplate formed as a cooler having a serpentine passageway comprising a plurality of cooling channels. This construction enables that heat produced by electronic components (e.g. power semiconductors) placed on the baseplate will be transferred through the baseplate to the circulating fluid coolant in the cooling channels so that the electronic components can be efficiently cooled.

The electronic device according to the invention comprises a cooling system according to the invention. The electronic device may comprise a baseplate and electronic components such as power semiconductors placed on the baseplate. The electronic device may be a power module.

In one embodiment, the cooling system is manufactured by a 3D-printer.

Accordingly, it may be an advantage to have a computer-readable medium having computer-executable instructions adapted to cause a 3D-printer to print a cooling system according to the invention.

BRIEF DESCRIPTION OF THE DRAWINGS

The invention will become more fully understood from the detailed description given herein below. The accompanying drawings are given by way of illustration only, and thus, they are not limitative of the present invention. In the accompanying drawings:

FIG. 3A shows a top view of a cooling system comprising a single large cooling arrangement;

FIG. 3B shows a top view of a cooling system comprising three smaller cooling arrangements;

FIG. 3C shows a perspective view of a first prior art cooling system;

FIG. 3D shows a perspective view of a second prior art cooling system;

FIG. 3E shows a perspective view of a third prior art cooling system;

FIG. 4A shows a top view of a first embodiment of a baffle of a cooling system according to the invention;

FIG. 4B shows a top view of a second embodiment of a baffle of a cooling system according to the invention;

FIG. 4C shows a top view of a third embodiment of a baffle of a cooling system according to the invention;

FIG. 4D shows a top view of a fourth embodiment of a baffle of a cooling system according to the invention;

FIG. 4E shows a top view of a fifth embodiment of a baffle of a cooling system according to the invention;

FIG. 4F shows a top view of a sixth embodiment of a baffle of a cooling system according to the invention;

FIG. 4G shows a top view of a seventh embodiment of a baffle of a cooling system according to the invention;

FIG. 4H shows a top view of an eighth embodiment of a baffle of a cooling system according to the invention;

FIG. 6A shows a perspective view of a first embodiment of a baffle of a cooling system according to the invention;

FIG. 6B shows a perspective view of a second embodiment of a baffle of a cooling system according to the invention and FIG. 6C shows a perspective view of a third embodiment of a baffle of a cooling system according to the invention;

FIG. 7A shows a cross-sectional view of an electronic device comprising a cooling system according to the invention;

FIG. 7B shows a cross-sectional view of another electronic device comprising a cooling system according to the invention;

DETAILED DESCRIPTION

Figure 1A:
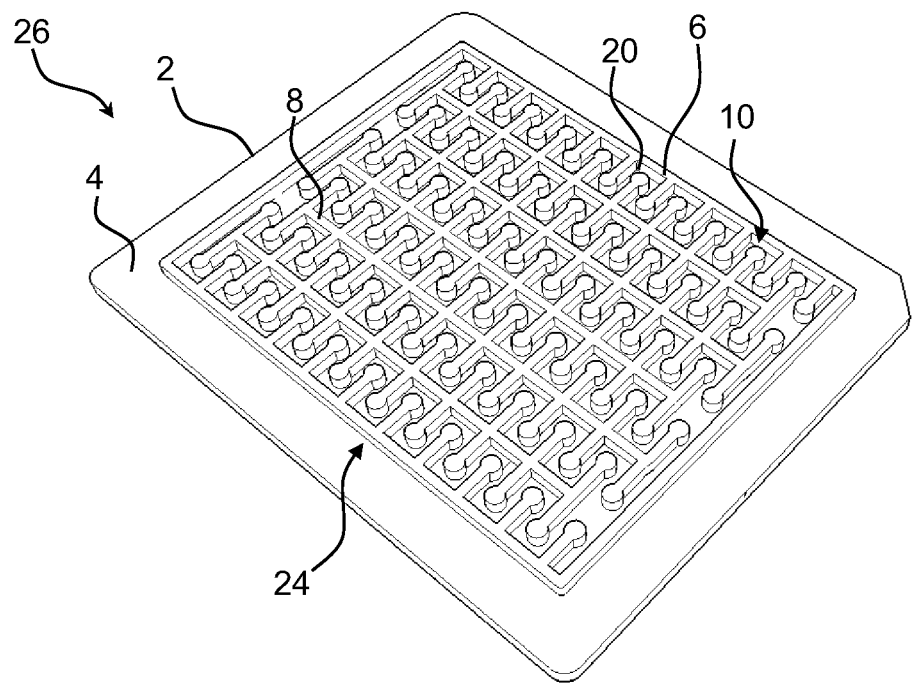
FIG. 1A shows a perspective view a cooling system according to the invention.

Referring now in detail to the drawings for the purpose of illustrating preferred embodiments of the present invention, a cooling system 26 of the present invention is illustrated in FIG. 1A.

FIG. 1A illustrates a perspective view a cooling system 26 according to the invention. The cooling system 26 comprises a cooling arrangement 24 provided with a serpentine passageway 20 configured to receive and guide a circulating fluid coolant (e.g. a water containing liquid). The passageway 20 is provided between a plurality of walls 6, 8 that are displaced from each other. A series of baffles 10 are disposed within the passageway 20. Each of the baffles 10 extends from a wall 6, 8 into the passageway 20.

It can be seen that each baffle 10 comprises a distal portion and a proximal portion, wherein the distal portion has a larger width than the proximal portion. The cooling arrangement 24 comprises an enclosure wall portion that encloses all the remaining walls and baffles 10 of the cooling arrangement 24. The enclosure wall is rectangular. The walls 6, 8 and the proximal portion of the baffles 10 have basically the same thickness.

The cooling arrangement 24 is placed on a plate member 4 constituting a baseplate 2. The baseplate 2 may be used for a power module comprising a number of power semiconductors (not shown).

Figure 1B:
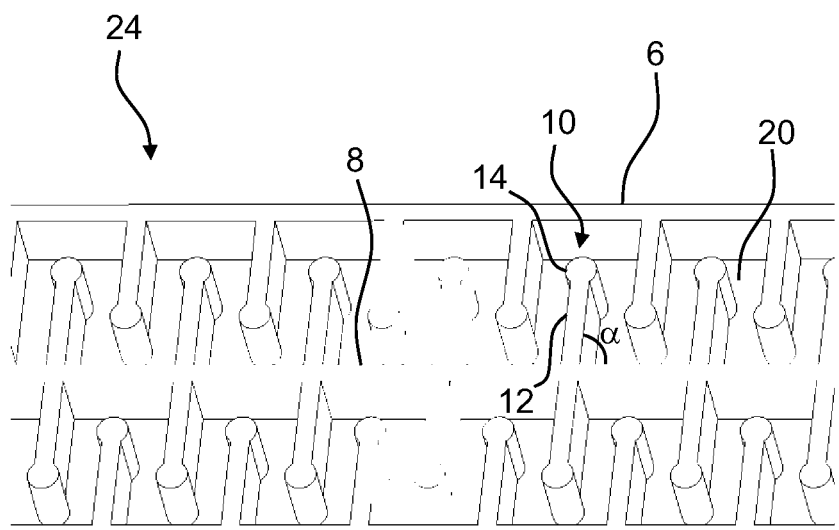
FIG. 1B shows a close-up view of a portion of the cooling system shown in FIG. 1A.

FIG. 1B illustrates a close-up view of a portion of the cooling arrangement 24 of the cooling system shown in FIG. 1A. The cooling arrangement 24 comprises a serpentine passageway 20 for a circulating liquid (such as water). The passageway 20 is provided between a plurality of walls 6 being displaced from each other. A plurality of baffles 10 are disposed within the passageway 20 in a manner in which each baffle 10 extends from a wall 6 into the passageway 20.

The angle α between adjacent walls 6 and baffles 10 is indicated. It can be seen that the angle α is about 90 degrees. Accordingly, the longitudinal axis of each baffle 10 extends basically perpendicular to the longitudinal axis of the wall from which the baffle 10 extends into the passageway 20. Moreover, it can be seen that the walls 6, 8 extend parallel to each other and that the baffles 10 extend parallel to each other.

Figure 2A:
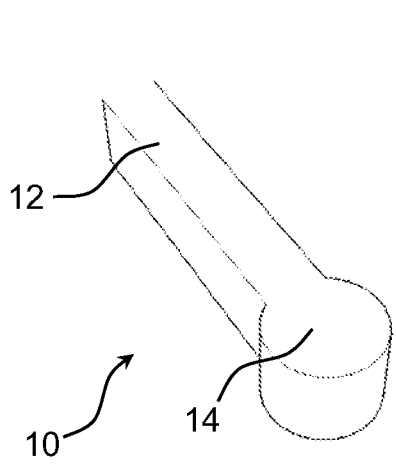
FIG. 2A shows a perspective view of a first embodiment of a baffle of a cooling system according to the invention.

FIG. 2A illustrates a perspective view of a first embodiment of a baffle 10 of a cooling system according to the invention. The baffle 10 comprises an elongated proximal portion 12 and a distal portion 14 extending in extension thereof. The distal portion 14 has a width that is larger than the width of the proximal portion 12. The proximal portion 12 has a rectangular cross section, whereas the distal portion 14 has a circular cross-section.

Figure 2B:
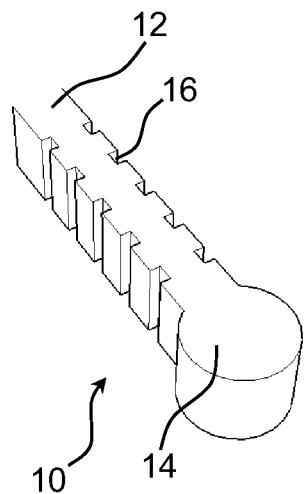
FIG. 2B shows a perspective view of a second embodiment of a baffle of a cooling system according to the invention.

FIG. 2B illustrates a perspective view of a second embodiment of a baffle 10 of a cooling system according to the invention. The baffle 10 comprises an elongated proximal portion 12 provided with a plurality of indentations 16. The indentations 16 are evenly distributed along two opposing upright surfaces of a portion of the proximal portion 12. The indentations 16 may, however, be arranged differently. The indentations 16 have a rectangular cross section, however, the may have another shape. In one embodiment, the indentations 16 have a semi-circular or semi-oval cross section. The baffle 10 comprises a distal portion 14 extending in extension of the proximal portion 12. The distal portion 14 corresponds to the one shown in FIG. 2A and has a width that is larger than the width of the proximal portion 12.

Figure 2C:
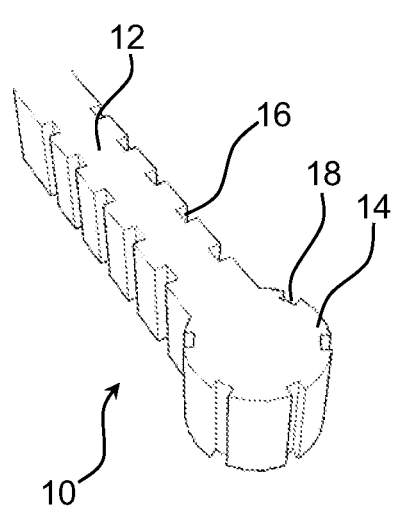
FIG. 2C shows a perspective view of a third embodiment of a baffle of a cooling system according to the invention.

FIG. 2C illustrates a perspective view of a third embodiment of a baffle 10 of a cooling system according to the invention. The baffle 10 basically corresponds to the one shown in FIG. 2B. The proximal portion 12 of the proximal portion 12, however, is provided with a plurality of indentations 16. The indentations 16 have a rectangular cross section, however, the may have another shape (e.g. a semi-circular or semi-oval cross section).

Figure 2D:
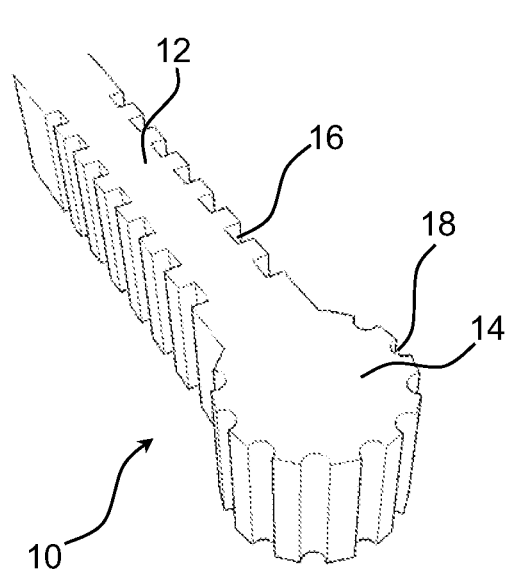
FIG. 2D shows a perspective view of a fourth embodiment of a baffle of a cooling system according to the invention.

FIG. 2D illustrates a perspective view of a fourth embodiment of a baffle 10 of a cooling system according to the invention. The baffle 10 comprises a proximal portion 12 provided with indentations 16 like the baffle 10 shown in FIG. 2C. The indentations 16, however, are arranged with a shorter distance between each other (between adjacent indentations 16). Furthermore, the distal portion 14 is provided with a plurality of evenly distributed indentations 18 extending axially along the outer periphery of the distal portion 14. The indentations 18 have a semi-circular cross section.

Figure 2E:
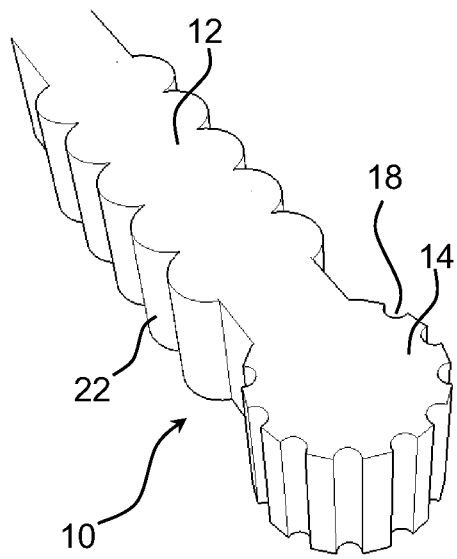
FIG. 2E shows a perspective view of a fifth embodiment of a baffle of a cooling system according to the invention.

FIG. 2E illustrates a perspective view of a fifth embodiment of a baffle 10 of a cooling system according to the invention. The baffle 10 comprises a distal portion 14 provided with indentations 18 like the baffle 10 shown in FIG. 2D. The baffle 10 comprises a proximal portion 12 provided with protrusions 22 evenly distributed along the two opposing upright surfaces of the proximal portion 12. The protrusions 22 have a semi-circular cross section and have the same height as the remaining portion of the proximal portion 12.

FIG. 3A illustrates a top view of a cooling system 26 comprising a single large cooling arrangement 24. The cooling arrangement 24 is arranged on a plate member 4 that may form a baseplate for a power module comprising a plurality of power semiconductors. The cooling arrangement 24 is centrally arranged on the plate member 4 and covers most of the plate member. Accordingly, the cooling arrangement 24 is capable of cooling heat generating components arranged almost everywhere on the plate member 4.

FIG. 3B illustrates a top view of a cooling system 26 comprising three smaller cooling arrangements 24, 24', 24" arranged on a plate member 4. The plate member 4 may form a baseplate for a power module. The cooling arrangements 24, 24', 24" is arranged on different positions on the plate member 4. Accordingly, the cooling arrangements 24, 24', 24" are capable of cooling heat generating components arranged in these positions. The cooling arrangements 24, 24', 24" may be arranged anywhere cooling is needed.

The size, geometry and number of cooling arrangements 24, 24', 24" may be selected according to the actual cooling requirements. In one embodiment, the cooling system 26 comprises two cooling arrangements. In one embodiment, the cooling system 26 comprises four cooling arrangements.

FIG. 3C illustrates a perspective view of a first prior art cooling system 26'. FIG. 3D shows a perspective view of a second prior art cooling system 26', whereas FIG. 3E illustrates a perspective view of a third prior art cooling system 26'. Each cooling system 26' comprises a cooling arrangement arranged on a baseplate 2. The cooling arrangement is provided with a serpentine passageway for a circulating liquid coolant. The passageway is provided between a plurality of walls displaced from each other and a series of baffles are disposed within the passageway. There is, however, no difference between the width of the distal portion of the baffles and the width of the proximal portion of the baffles.

FIG. 4A illustrates a top view of a first embodiment of a baffle of a cooling system according to the invention. The baffle comprises a proximal portion 12 having a length $L_2$ and a width $W_1$ and a distal portion 14 having a length $L_1$ and a width $W_1$. It can be seen that the width $W_2$ of the distal portion 14 is larger than the width $W_1$ of the proximal portion 12. The distal portion 12 has a circular cross section, whereas the proximal portion 14 has a rectangular cross section. The angle β between the adjacent side walls of the proximal portion 14 and the distal portion 12 is about 120°.

FIG. 4B illustrates a top view of a second embodiment of a baffle of a cooling system according to the invention, wherein the baffle comprises a distal portion 12 having a rectangular cross section and a proximal portion 14 having a rectangular cross section. The width $W_2$ of the distal portion 14 is larger than the width $W_1$ of the proximal portion 12. The angle β between the adjacent side walls of the proximal portion 14 and the distal portion 12 is 90°.

FIG. 4C illustrates a top view of a third embodiment of a baffle of a cooling system according to the invention. The baffle comprises a distal portion 12 having a square cross section and a proximal portion 14 having a rectangular cross section. The width $W_2$ of the distal portion 14 is larger than the width $W_1$ of the proximal portion 12. The angle β between the adjacent side walls of the proximal portion 14 and the distal portion 12 is 90°.

FIG. 4D illustrates a top view of a fourth embodiment of a baffle of a cooling system according to the invention. The baffle comprises a distal portion 12 having a cross section formed as a square with rounded corners and a proximal portion 14 having a rectangular cross section. The width $W_2$ of the distal portion 14 is larger than the width $W_1$ of the proximal portion 12. The angle β between the adjacent side walls of the proximal portion 14 and the distal portion 12 is 90°.

FIG. 4E illustrates a top view of a fifth embodiment of a baffle of a cooling system according to the invention. The baffle comprises a distal portion 12 having a hexagonal cross section and a proximal portion 14 having a rectangular cross section. The width $W_2$ of the distal portion 14 is larger than the width $W_1$ of the proximal portion 12. The angle β between the adjacent side walls of the proximal portion 14 and the distal portion 12 is 120°.

FIG. 4F illustrates a top view of a sixth embodiment of a baffle of a cooling system according to the invention. The baffle comprises a distal portion 12 having a star-shaped cross section and a proximal portion 14 having a rectangular cross section. The width $W_2$ of the distal portion 14 is larger than the width $W_1$ of the proximal portion 12. The angle β between the adjacent side walls of the proximal portion 14 and the distal portion 12 is 90°.

FIG. 4G illustrates a top view of a seventh embodiment of a baffle of a cooling system according to the invention. The baffle comprises a distal portion 12 having an oval cross section and a proximal portion 14 having a rectangular cross section. The width $W_2$ of the distal portion 14 is larger than the width $W_1$ of the proximal portion 12. The angle β between the adjacent side walls of the proximal portion 14 and the distal portion 12 is 90°.

FIG. 4H illustrates a top view of an eighth embodiment of a baffle of a cooling system according to the invention. The baffle comprises a distal portion 12 having an oval cross section and a proximal portion 14 having a rectangular cross section. The width $W_2$ of the distal portion 14 is larger than the width $W_1$ of the proximal portion 12. In all embodiments shown in FIG. 4A-FIG. 4H the length $L_2$ of the proximal portion 12 is larger than the length $L_1$ of the distal portion 12. The angle β between the adjacent side walls of the proximal portion 14 and the distal portion 12 is 90°.

Figure 5:
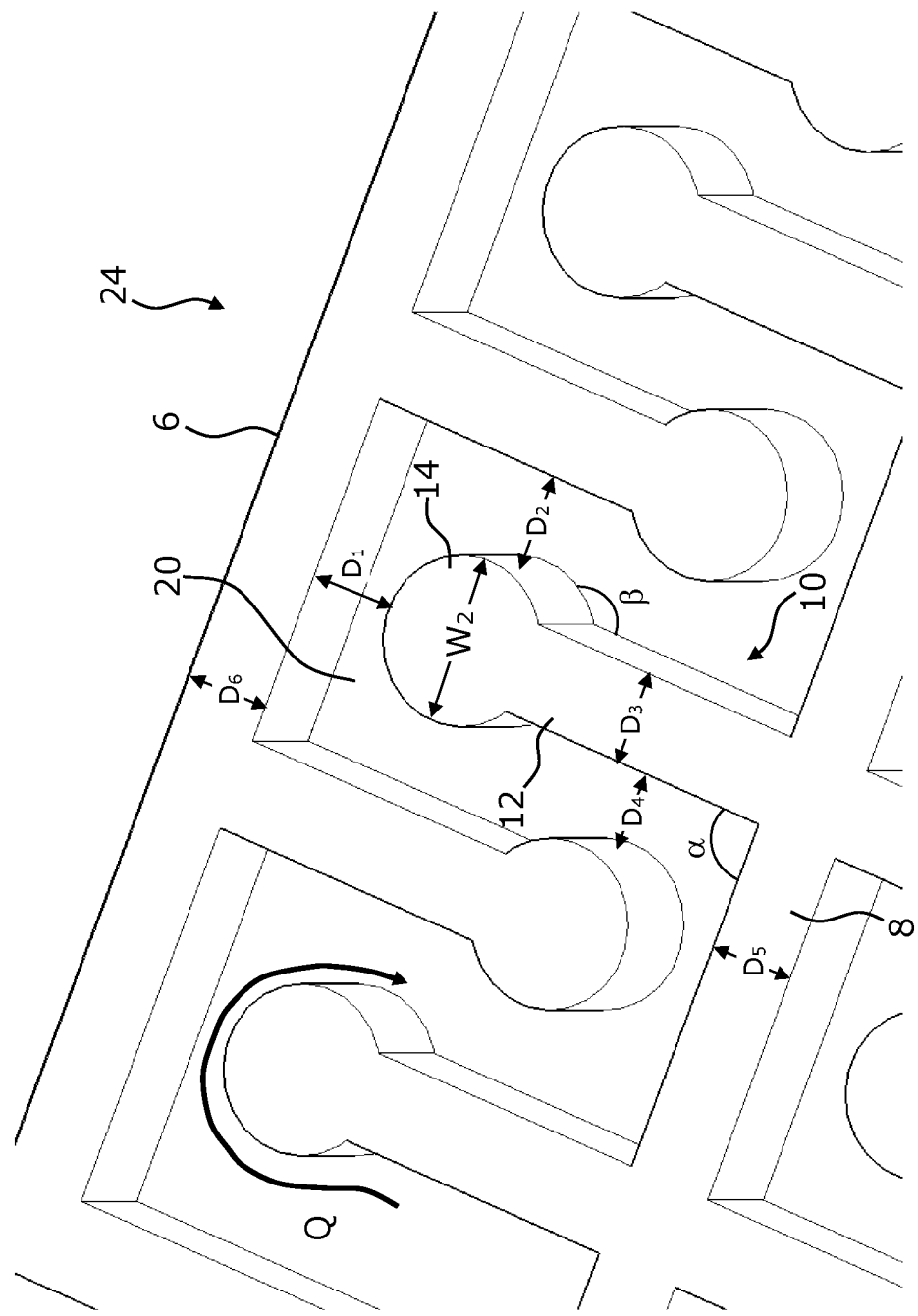
FIG. 5 shows a perspective close-up view of a portion of a cooling system according to the invention.

FIG. 5 illustrates a perspective close-up view of a portion of a cooling arrangement 24 of a cooling system according to the invention. The cooling arrangement 24 comprises parallel walls 6, 8 and a plurality of parallel baffles 10 each having a proximal portion 12 and a distal portion 14. The baffles 10 are disposed within a passageway 20 and extend from one of the walls 6, 8 into the passageway 20. For each baffle 10 the distal portion 14 has a width $W_2$ that is larger than the width $W_1$ of the proximal portion 12 of the baffle 10.

It can be seen that the thickness $D_5$ (the distance between two opposing upright surfaces) of the wall 8 corresponds to the thickness $D_6$ (the distance between two opposing upright surfaces) of the wall 6 and the thickness $D_3$ (the distance between two opposing upright surfaces) of the proximal portion 12 of the baffle 10.

The distance $D_2$ between adjacent baffles 10 corresponds basically the distance $D_1$ between the distal portion 14 and the adjacent wall 6 and the $D_4$ between the distal portion of a baffle and the and the proximal portion 12 of the adjacent baffle 10. The angle α between a wall 8 and the proximal portion 12 of the baffle 10 extending therefrom is about 90 degrees. Therefore, the longitudinal axis of each baffle 10 extends basically perpendicular to the longitudinal axis of the wall 6, 8 from which the baffle 10 extends into the passageway 20. Moreover, it can be seen that the proximal portions 12 of the baffles 10 extend parallel to each other. The angle β between the adjacent side walls of the proximal portion 14 and the distal portion 12 about 120°.

FIG. 6A illustrates a perspective view of a first embodiment of a baffle 10 of a cooling system according to the invention, whereas FIG. 6B illustrates a perspective view of a second embodiment of a baffle 10 of a cooling system according to the invention. Each baffle 10 comprises a box-shaped proximal portion 12 provided with arced indentations 16 extending along the two opposing upright surfaces of the proximal portion 12. The two opposing upright surfaces a parallel to the plane spanned by the longitudinal axis X of the baffle 10 and the axis Y extending perpendicular to the top surface of the proximal portion 12 and the longitudinal axis X. Each indentation 16 extends along the lateral axis Z.

The baffle 10 shown in FIG. 6A comprises a cylindrical distal portion 14. The length of the distal portion 14 extends parallel to axis Z. The baffle 10 shown in FIG. 6B comprises a cylindrical distal portion 14 provided with indentations 18 having a semi-circular cross section. The length of the distal portion 14 and the length of the indentations extend parallel to each other and to axis Z. The angle β between the adjacent side walls of the proximal portion 12 and the distal portion 14 about 120°. In FIG. 6A, the side wall of the proximal portion 12 extends along the longitudinal axis X and the Y axis, whereas the side wall of the distal portion 14 extends along a cylindrical portion having a longitudinal axis extending parallel to the Y axis. In FIG. 6B though, the side wall of the distal portion 14 extends along a cylindrical portion having a longitudinal axis extending parallel to the Y axis, wherein the cylindrical portion is provided with indentations 18.

FIG. 6C illustrates a perspective view of a third embodiment of a baffle 10 of a cooling system according to the invention. The baffle 10 comprises a box-shaped proximal portion 12 and a cylindrical distal portion 14. A plurality of protrusions 22' are evenly distributed along the outer periphery of the proximal portion 12. The angle β between the adjacent side walls of the proximal portion 14 and the distal portion 14 about 120°.

FIG. 7A illustrates a cross-sectional view of an electronic device 30 comprising a cooling system according to the invention. The electronic device 30 comprises several semiconductors 32 placed on a baseplate 2 having a plurality of cooling channels 20. The semiconductors 32 are covered by a mold encapsulation 28.

The electronic device 30 comprises a lid 34 attached to the baseplate 2 in order to close the cooling channels 20. Accordingly, the cooling system is configured to allow a circulating fluid coolant to flow along the cooling channels 20 each provided between a plurality of walls displaced from each other. It can be seen that the open end of the cooling channels 20 is closed with a structure formed as a lid 34. The heat produced by the semiconductors 32 will be transferred through the baseplate 2 to the circulating fluid coolant in the cooling channels 20.

FIG. 7B illustrates a cross-sectional view of another electronic device 30 comprising a cooling system according to the invention. The electronic device 30 is provided with semiconductors 32 that are placed on a baseplate 2 and covered by a mold encapsulation 28. A cooler 36 having a plurality of cooling channels 20 is attached to the lower side of the baseplate 2. The cooling system is configured to allow a circulating fluid coolant to flow along the cooling channels 20. It can be seen that the open end of the cooling channels 20 is closed with a lid-like structure that is the baseplate 2. The heat produced by the semiconductors 32 will be transferred through the flat baseplate 2 to the circulating fluid coolant in the cooling channels 20.

Figure 8A:
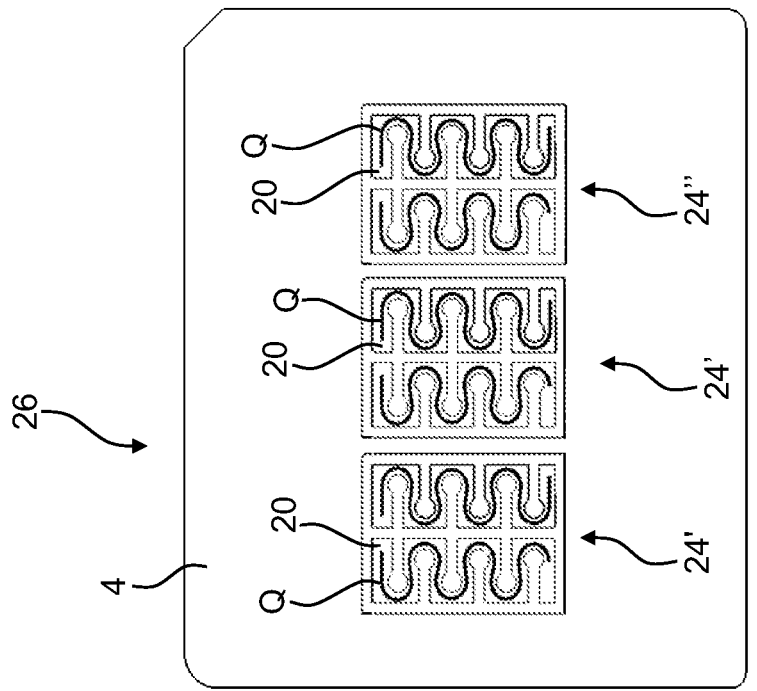
FIG. 8A shows a top view of a cooling system according to the invention.

FIG. 8A illustrates a top view of a cooling system 26 according to the invention. The cooling system 26 corresponds to the one shown in FIG. 1A and FIG. 3A. In FIG. 8A, however, the pattern of the flow Q of a circulating fluid coolant in one section of the serpentine passageway 20 is indicated. It is important to underline that the circulating fluid coolant will flow in the other sections of the serpentine passageway 20 as well even through this is not shown in FIG. 8A.

It can be seen that the flow Q of a circulating fluid coolant follows a certain flow pattern. The flow pattern is a wavy-like pattern, which can be also expressed as curved zig zag pattern or a zig zag with rounded angles. It can be seen that the flow on either side of a baffle is in opposite directions. As the circulating fluid coolant flows past the thicker distal portions 14 of a baffle 10, the circulating fluid coolant changes direction substantially.

The thicker distal portions 14 of the baffles 10 create a flow pattern that goes around the distal portions 14 and hereby eliminate dead spots that are present in the prior art cooling systems.

Figure 8B:
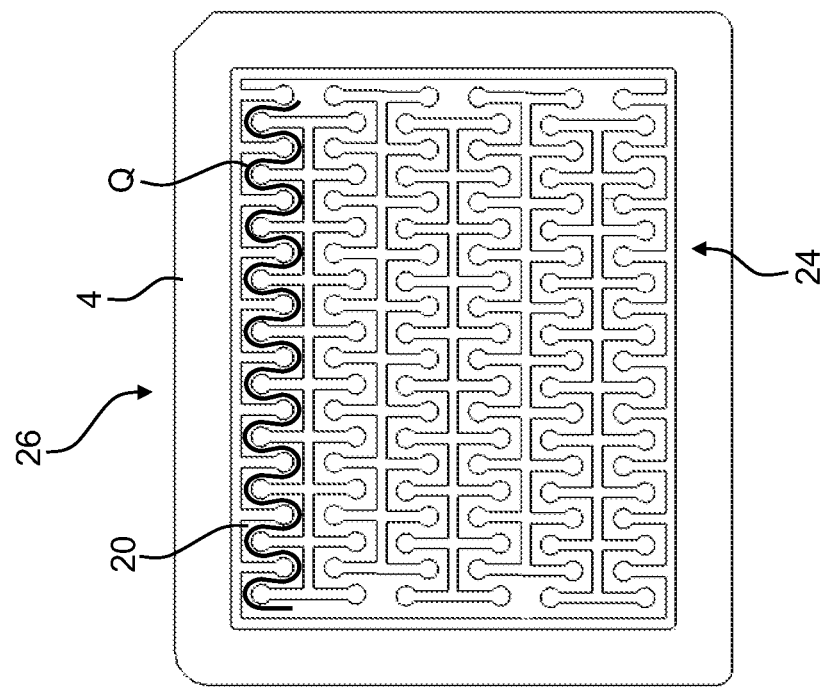
FIG. 8B shows a top view of a cooling system according to the invention.

FIG. 8B illustrates a top view of a cooling system 26 according to the invention. The cooling system 26 corresponds to the one shown in FIG. 1A and FIG. 3A. In FIG. 8A, however, the pattern of the flow Q of a circulating fluid coolant in one section of the serpentine passageway 20 is indicated. It is important to underline that the circulating fluid coolant will flow in the other sections of the serpentine passageway 20 as well even through this is not shown in FIG. 8A.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A cooling system comprising a serpentine passageway for a circulating fluid coolant, wherein the passageway is provided between a plurality of walls displaced from each other, wherein a series of baffles each having a proximal portion and a distal portion are disposed within the passageway, said baffles extending from one of the walls into the passageway, wherein the distal portion has a width that is larger than the width of the proximal portion and that the proximal portion and the distal portion comprise adjacent side walls, wherein the angle between said adjacent sidewalls is less than 180°.

2. The cooling system according to claim 1, wherein the baffles are designed to create a flow on either side of a baffle, wherein the flow on either side of the baffle is in opposite directions.

3. The cooling system according to claim 1, wherein the length of the proximal portion is larger than the length of the distal portion.

4. The cooling system according to claim 1, wherein a number of indentations are provided in the proximal portion.

5. The cooling system according to claim 1, wherein a number of indentations are provided in the distal portion.

6. The cooling system according to claim 1, wherein a number of protrusions are provided in the proximal portion.

7. The cooling system according to claim 1, wherein a number of protrusions are provided in the distal portion.

8. The cooling system according to claim 1, wherein the cooling system comprises a single cooling arrangement.

9. The cooling system according to claim 8, wherein the cooling arrangement is arranged on a baseplate.

10. The cooling system according to claim 1, wherein the cooling system comprises two cooling arrangements disposed on a baseplate.

11. The cooling system according to claim 1, wherein the cooling system comprises three or more cooling arrangements disposed on a baseplate.

12. The cooling system according to claim 1, wherein the cross section of the distal portion is circular.

13. The cooling system according to claim 1, wherein the baffles extend parallel to each other.

14. The cooling system according to claim 1, wherein the baffles extend basically perpendicular to the wall, from which the baffles extend into the passageway.

15. The cooling system according to claim 1, wherein the baffles are fixed to the wall from which they extend.

16. An electronic device comprising a cooling system according to claim 1.

17. A computer-readable medium having computer-executable instructions adapted to cause a 3D-printer to print a cooling system according to claim 1.

* * * * *